(12) United States Patent
Oldfield

(10) Patent No.: US 6,660,174 B2
(45) Date of Patent: Dec. 9, 2003

(54) METHOD OF MANUFACTURING A MICROSTRIP EDGE GROUND TERMINATION

(75) Inventor: William W. Oldfield, Redwood City, CA (US)

(73) Assignee: Anritsu Company, Morgan Hill, CA (US)

( * ) Notice: Subject to any disclaimer, the term of this patent is extended or adjusted under 35 U.S.C. 154(b) by 64 days.

(21) Appl. No.: 09/960,891

(22) Filed: Sep. 21, 2001

(65) Prior Publication Data

US 2003/0057181 A1 Mar. 27, 2003

(51) Int. Cl.[7] .............................................. H01B 13/00
(52) U.S. Cl. .............................. 216/13; 216/22; 216/74; 216/100; 333/246
(58) Field of Search .............................. 216/13, 22, 74, 216/100; 333/246

(56) References Cited

U.S. PATENT DOCUMENTS

| | | | | |
|---|---|---|---|---|
| 3,638,148 A | * | 1/1972 | Hallford et al. | 333/246 |
| 3,967,218 A | * | 6/1976 | McGowan | 333/24.2 |
| 4,364,078 A | * | 12/1982 | Smith et al. | 257/620 |
| 5,160,904 A | * | 11/1992 | Babbitt et al. | 333/246 |
| 5,628,053 A | * | 5/1997 | Araki et al. | 455/86 |
| 6,127,908 A | * | 10/2000 | Bozler et al. | 333/246 |
| 2002/0158798 A1 | * | 10/2002 | Chiang et al. | 342/372 |

FOREIGN PATENT DOCUMENTS

JP    411220059 A   *   8/1999

OTHER PUBLICATIONS

Caldwell Barry and Don Getty, EDN Access–Jul. 6, 2000 Coping with SCSI at Gighertz Speeds (Printed Apr. 25, 2001) http://www.ednmag.com.

CMD Products (Printed Apr. 25, 2001) http://www.calmicro.com.

Introduction to Transmission Lines (EXPERIMENTAL) (Printed Apr. 25, 2001) http://onlinetools.chipcenter.com.

Maloratsky G. Leo, Reviewing the Basics of Microstrip Lines (Printed Apr. 25, 2001) http://www.metcladinternationla.com.

U.S. application Ser. No. 09/957,791, William W. Oldfield, filed Sep. 21, 2001.

* cited by examiner

Primary Examiner—Benjamin L. Utech
Assistant Examiner—Shamim Ahmed
(74) Attorney, Agent, or Firm—Fleisler Dubb Meyer & Lovejoy LLP

(57) ABSTRACT

A method of manufacturing a microstrip termination is provided, the microstrip termination containing a transmission line, a tapered edge ground and a thin film resistor connecting a transmission line to the tapered edge ground. Circuits are manufactured by first cutting holes in a substrate forming alignment holes for dicing the substrate into separate circuits. A saw is then used to cut tapered grooves along the alignment holes for forming tapered edges. The substrate is then plated and etched to form the transmission lines, thin film resistors, and ground planes. Finally, the substrate is diced into the separate termination circuits.

11 Claims, 8 Drawing Sheets

- Prior Art -

- Prior Art -

- Prior Art -

METHOD OF MANUFACTURING A MICROSTRIP EDGE GROUND TERMINATION

CROSS-REFERENCE TO RELATED APPLICATION

The following application is cross-referenced and incorporated herein by reference:

U.S. patent application Ser. No. 09/957,791, now issued U.S. Pat. No. 6,525,631, entitled "SYSTEM AND METHOD FOR IMPROVED MICROSTRIP TERMINATION," inventor William W. Oldfield, filed concurrently herewith and incorporated herein by reference.

TECHNICAL FIELD

The present invention relates generally to a microstrip termination. More particularly, the present invention relates to a microstrip termination using a grounded thin film resistor.

BACKGROUND

Terminations are common components in most microwave systems. Microstrip terminations are easy to process using thin film technology, but the performance drops off rapidly with increasing frequency. Thin film technology typically uses an alumina substrate, with gold and resistor material sputtered onto the substrate, which is then patterned with photolithography techniques to define transmission line traces and resistors. Thick films could also be used, but they typically do not go to high frequencies (above 20 Ghz).

FIG. 1 illustrates a standard microstrip termination, known as an edge ground circuit. In the microstrip 100 of FIG. 1, a microstrip transmission line 104, typically a metal line, is formed on the microstrip substrate 102, made of a dielectric such as alumina. An area of resistive material 106 is formed on the substrate 102 along the transmission line 104 near an edge ground. The edge ground is formed with a transmission line 110 connecting the resistive material 106 to the metal plated edge 108 which connects to a metal ground plane 112 deposited on the bottom surface of the substrate below the trace and resistive material. The resistive material 106 is used to terminate a signal propagating along the transmission line by matching the impedance of the transmission line and preventing reflection of the propagating signal.

FIG. 2 illustrates another standard microstrip termination used when a termination is required away from an edge. This termination 200 also includes a microstrip substrate 202 typically having a metal bottom layer 212, a transmission line 204, and an area of thin film resistive material 206. The substrate 202 also has an area of metal 208 between the resistive material 206 and the edge of the substrate 202. The substrate 202 typically contains Monolithic Microwave Integrated Circuits (MMICs) connected to the transmission line 204, and the substrate 202 is mounted on a carrier. A carrier is typically a thin metal plate, on the order of ½ to 1 mm thick, and provides the ground for the microstrip substrate and the MMICs thereon in addition to the metal bottom layer 212.

The termination of FIG. 2 further uses a ground via 210. The via 210 is formed from metal deposited in a hole in the substrate that extends from the area of metal 208 on the top surface of the substrate to the metal bottom layer 212. The termination shown in FIG. 2 can be placed anywhere in a subsystem circuit, but the performance is generally worse than the edge ground circuit of FIG. 1. The poor performance is due to the increased inductance to ground resulting from the small via.

FIG. 3 shows the typical performance of an edge grounded microstrip termination. One reason for the poor performance illustrated in the figure is that the "environment" of the resistor is not correct.

It is desired that a DC to microwave termination be a reflectionless transition from the transmission line impedance of Zo to ground. The reactive part of the transition should, therefore, match the resistive part from the Zo ohm line to ground. For instance, if the midway resistance of a 50 ohm termination resistor is 25 ohms, the surrounding reactive environment is preferably also 25 ohms. In a coaxial termination, the outer conductor diameter over the resistor is tapered down from the 50 ohm diameter to the diameter of the resistor at the ground end, to provide a smooth impedance transition "environment." It is therefore desirable to provide a microstrip termination that sufficiently prevents signal reflection by providing a smooth impedance transition.

BRIEF SUMMARY

In accordance with the present invention, a method is provided for manufacturing circuits having a microstrip termination formed by a transmission line providing a signal through a thin film resistor on the top surface of a substrate through a metal coated tapered edge to a ground plane formed on a bottom of a substrate. Several circuit regions with tapered ground planes are first formed by first cutting holes in a substrate with a laser drill, and then cutting grooves in the substrate with a diamond saw along the holes. Edges of the grooves are sawed to form an angle with the surface of the substrate for creating the tapered edges. Conductive material is deposited on the substrate, then etched in order to form a transmission line pattern and ground regions. A portion of the transmission line is then etched away to form a thin film resistor of the top surface of the substrate. The substrate is then diced along the laser drill alignment markings in order to form individual circuits, each circuit having a transmission line pattern, an area of resistive material, and a tapered edge ground.

BRIEF DESCRIPTION OF THE DRAWINGS

The invention will be described with respect to particular embodiments thereof, and reference will be made to the drawings, in which.

DETAILED DESCRIPTION

Figure 1:
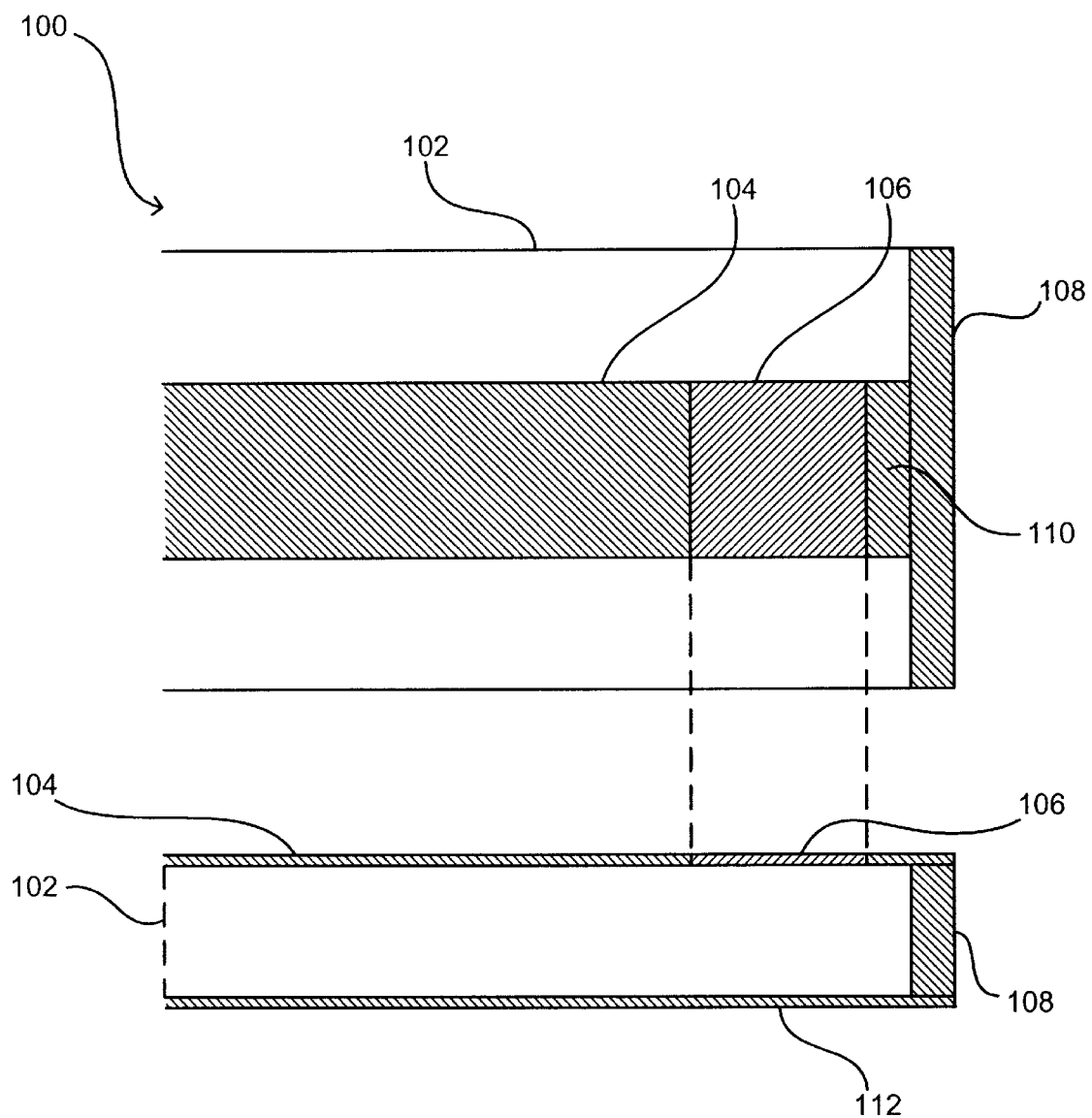
FIG. 1 is a front and side view of a prior art microstrip termination.
Figure 2:
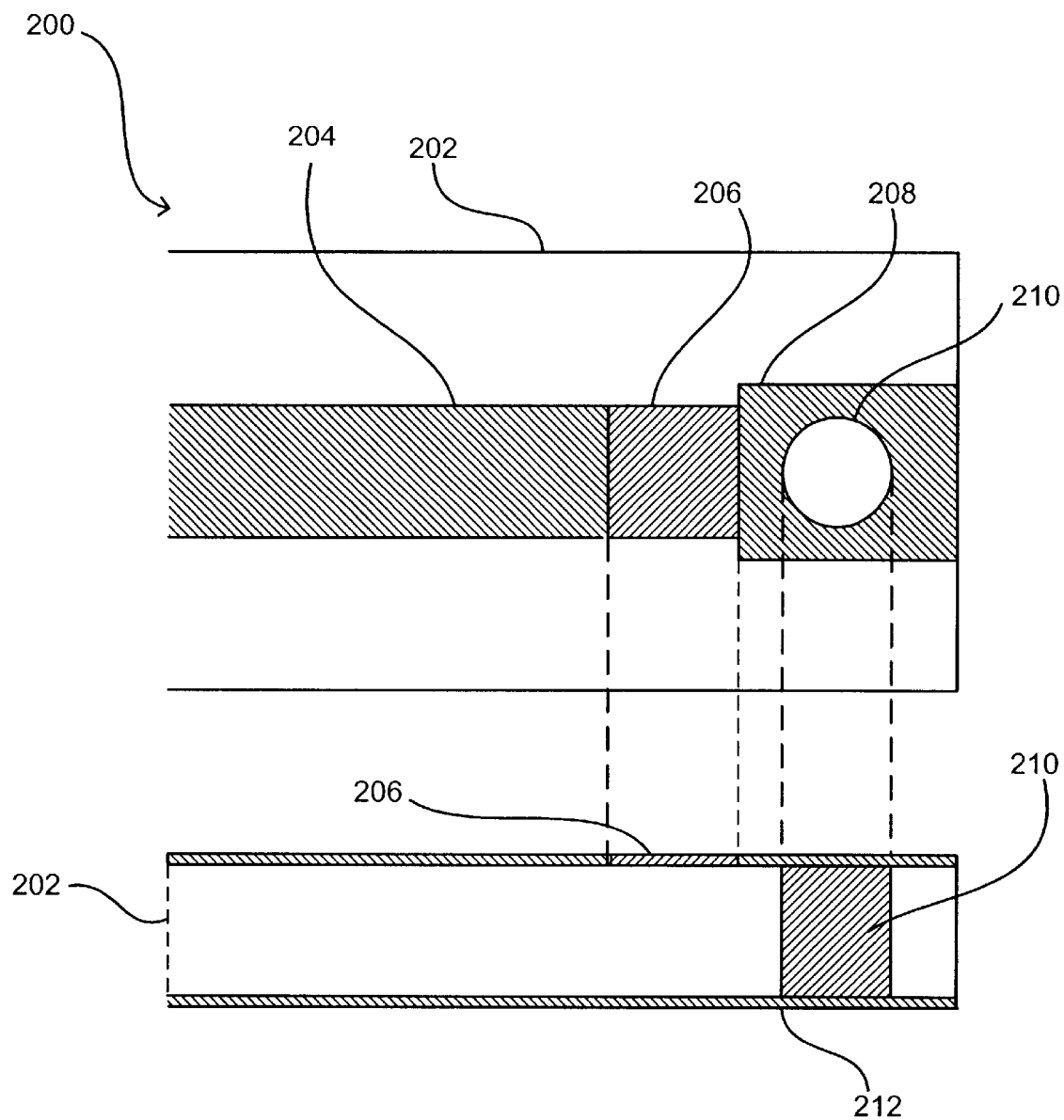
FIG. 2 is a front and side view of another prior art microstrip termination.
Figure 3:
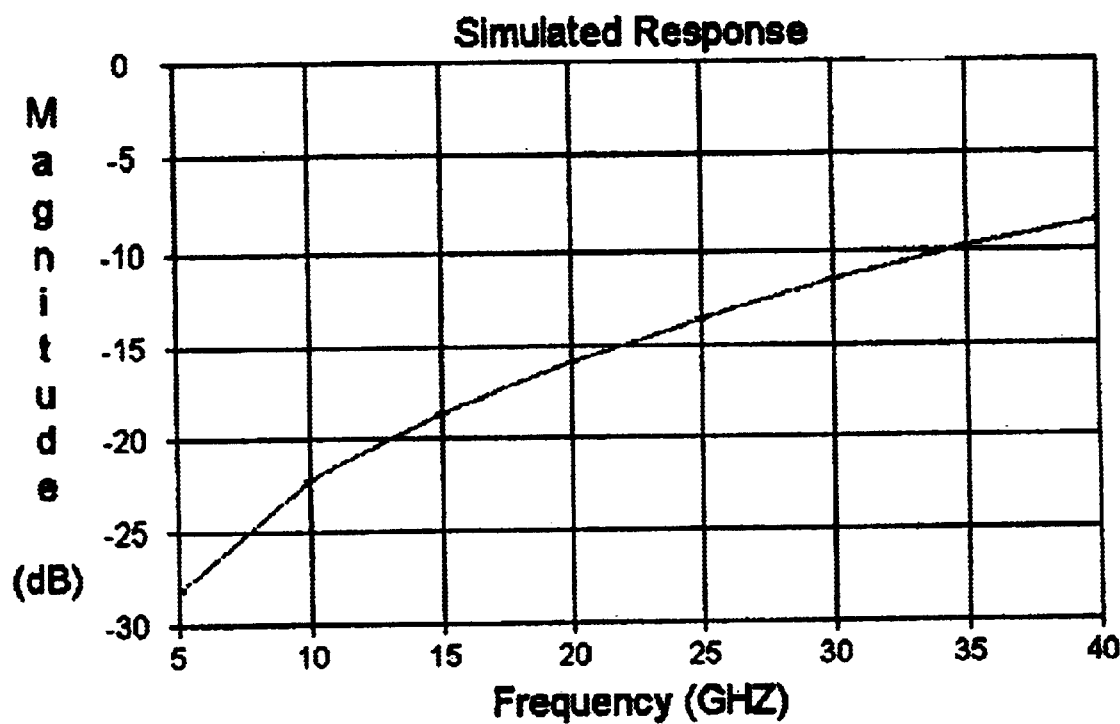
FIG. 3 is a graph showing the typical return loss for a standard microstrip termination of FIG. 2.
Figure 4A:
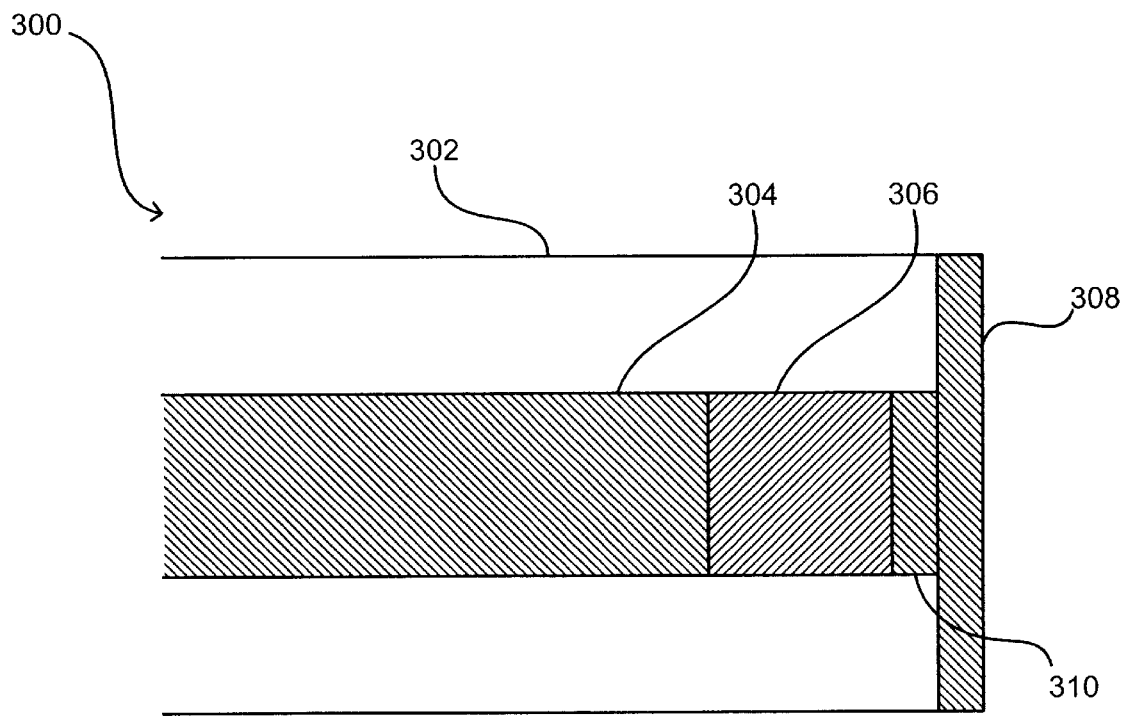
FIGS. 4A and 4B are front and side views of a microstrip termination in accordance with one embodiment of the present invention.
Figure 4B:
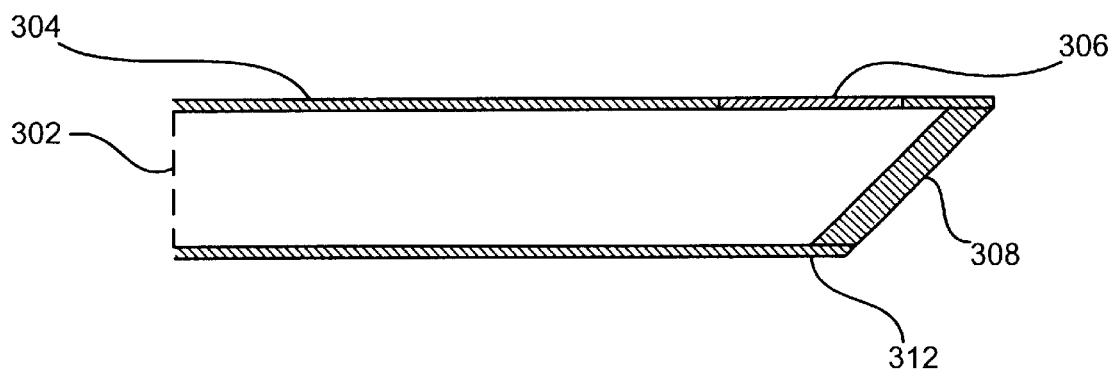

FIGS. 4A and 4B illustrate a microstrip termination 300 in accordance with one embodiment of the present invention. The termination 300 includes a microstrip substrate 302 having a metal transmission line 304 passing on the top surface of the substrate of the substrate. A resistor 306, or area of a thin film resistive material, is positioned along the transmission line 304 near the edge of the substrate. A transmission line segment 310 may extend between the resistive area 306 and a tapered ground plane. The tapered ground plane comprises a metal plated edge 308 that connects the transmission line segment 310 to a metal ground plane region 312 deposited on the bottom of the substrate 302 below the transmission line 304 and resistor 306. The edge 308 of the substrate is tapered, or angled, with respect to the top and bottom surfaces of the substrate. The taper is of an angle such that the proper impedance matching, or impedance environment, is obtained for a signal propagating through the termination to ground. The taper is between 0 degrees and 90 degrees, and preferably about 30 degrees. The taper may start before the left edge of the resistor 306 in FIG. 4, below the resistor, or after the right edge of the resistor, preferably starting just before the left edge of the resistor.

Figure 5:
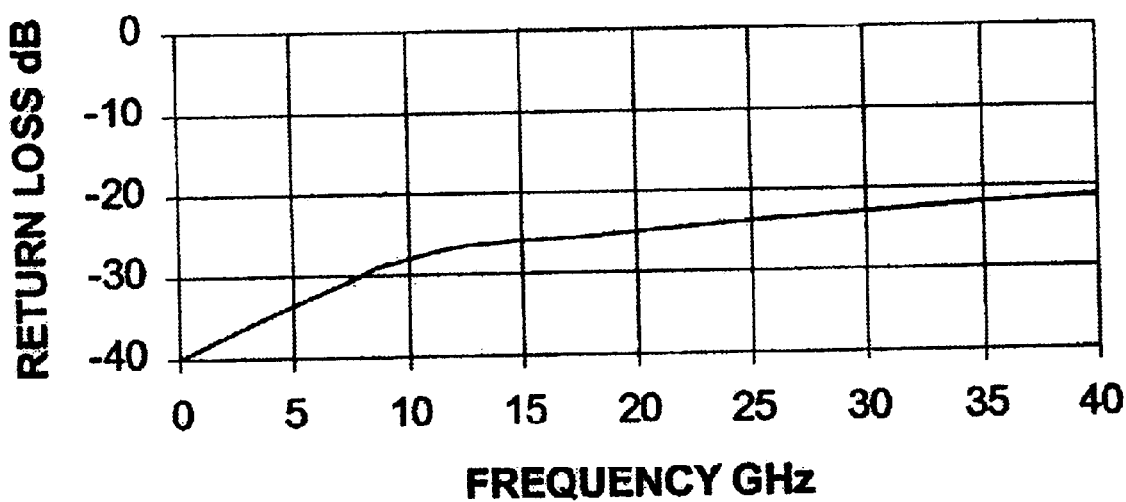
FIG. 5 is a graph showing the improved performance of a microstrip termination in accordance with one embodiment of the present invention.

FIG. 5 illustrates the improved performance of a microstrip termination using a tapered ground plane as shown in FIG. 4. Results may vary depending on a number of factors, including taper angle, substrate thickness, and signal strength.

Figure 6A:
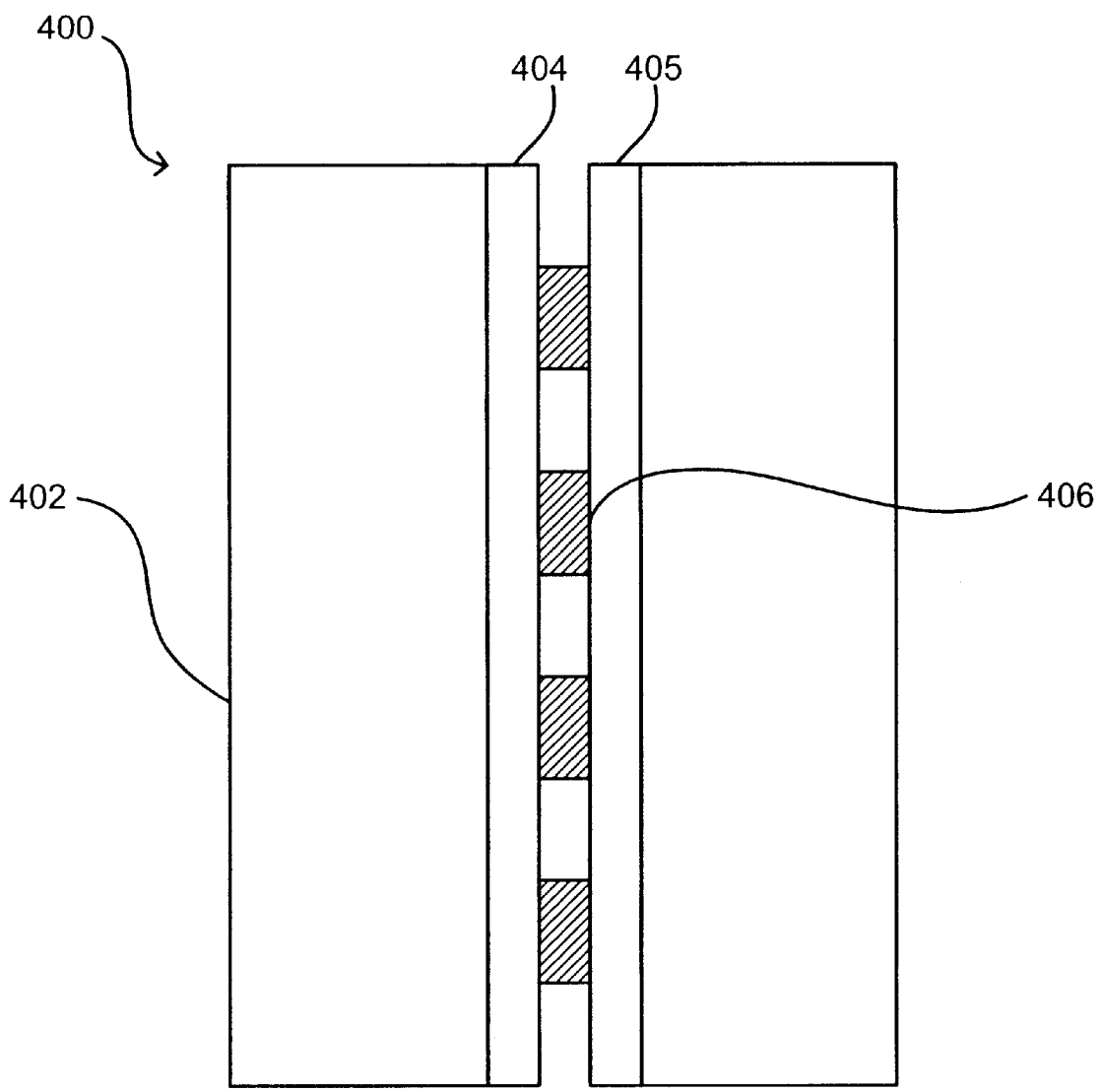
FIGS. 6A and 6B show front and side views of a stage in the manufacturing process of a microstrip termination in accordance with one embodiment of the present invention.
Figure 6B:
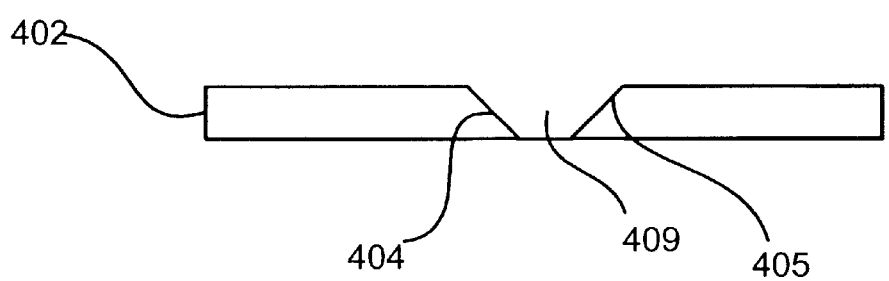

Stages of a manufacturing process for a microstrip termination as illustrated in FIGS. 4A and 4B are shown in FIGS. 6–8. FIG. 6A shows a first stage 400 in a process, including a substrate 402, preferably made from alumina, after an initial round of processing. In order to separate tapered ground plane regions so that metal may later be deposited to connect the tapered plane to ground, and provide a saw alignment for later cutting of tapered edges for circuits, a drill, laser, or other appropriate device is used to drill holes 406 in the substrate 402 along what will become the tapered edge of the circuits. Once the holes are drilled, a sawing device such as a diamond saw is used to form the tapered edge of the circuits. The saw creates a tapered edge 404, preferably tapered about 30 degrees from the top surface of the substrate as shown in FIG. 6B. A second tapered edge 405 is also created. In one embodiment, the size of the holes 406 drilled in the substrate are slightly larger than the final saw kerf 409. Saw kerf 409 is typically defined as the width of the path cut by a saw as the saw moves through the substrate. The drill holes allow for easier travel of the saw.

Figure 7A:
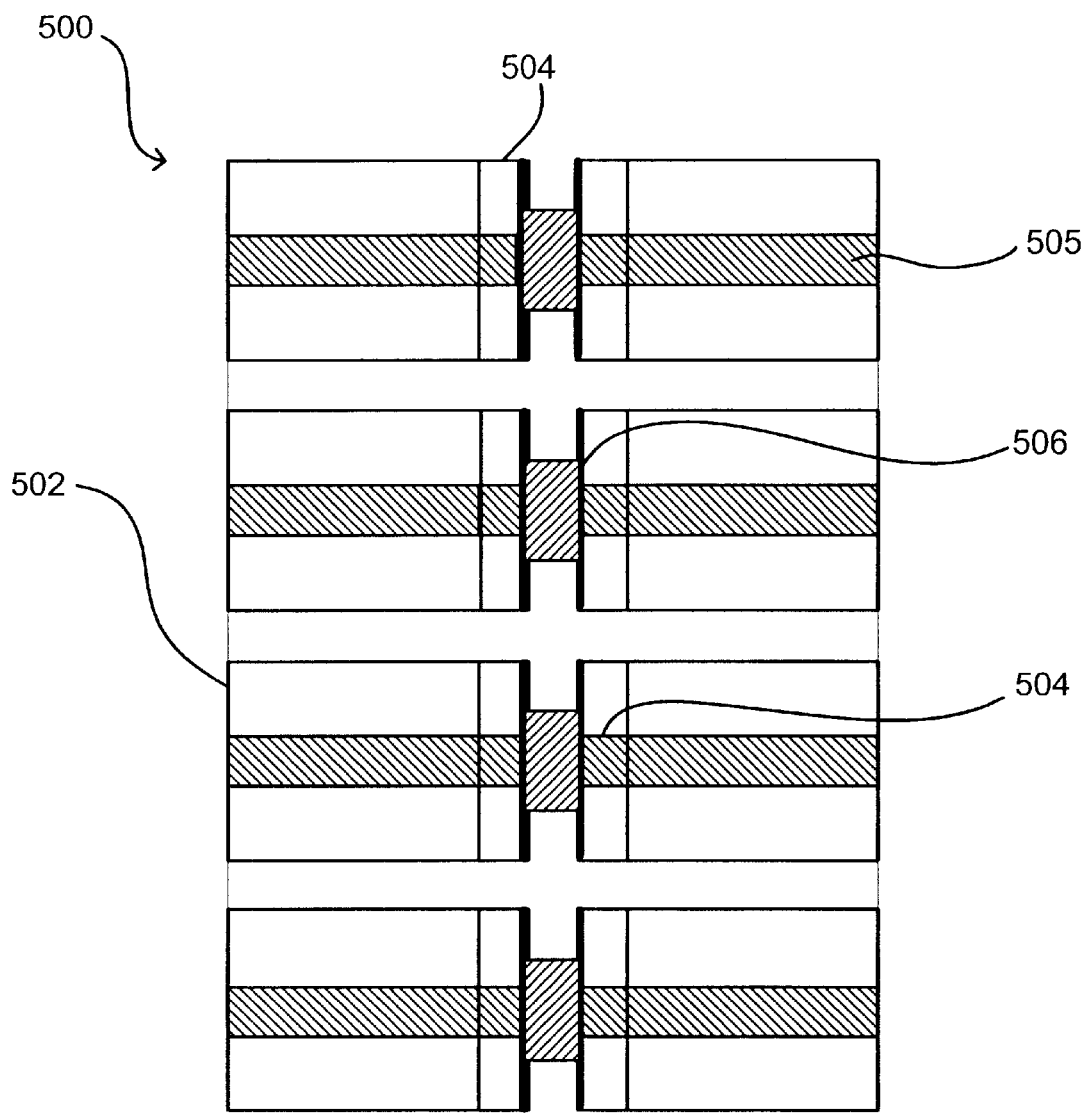
FIGS. 7A and 7B show front and side views of a stage in the manufacturing process of a microstrip termination in accordance with one embodiment of the present invention.
Figure 7B:
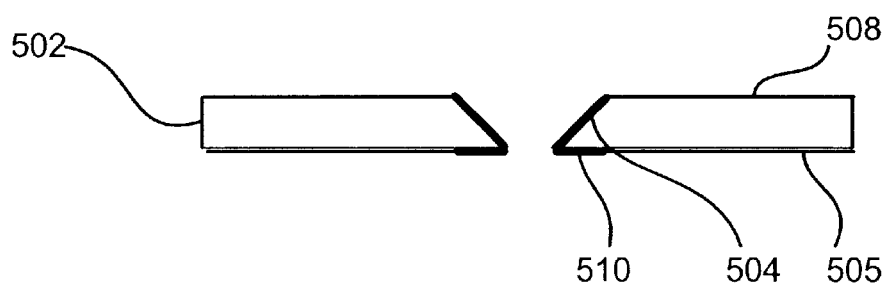

A second stage 500 in a process for manufacturing the tapered ground plane circuits is shown in FIGS. 7A and 7B. After the alumina has been drilled and grooves cut, the substrate is sputtered with gold or metal with standard processing techniques. A mask may then be positioned on the substrate so the sputtered metals may be etched to form the final pattern. The final pattern includes a transmission line 505, bottom ground plane 508, a tapered ground plane 504, and in the area of the resistive material 510. At this point, the substrate 502 is etched but yet not diced into individual circuits.

Figure 8A:
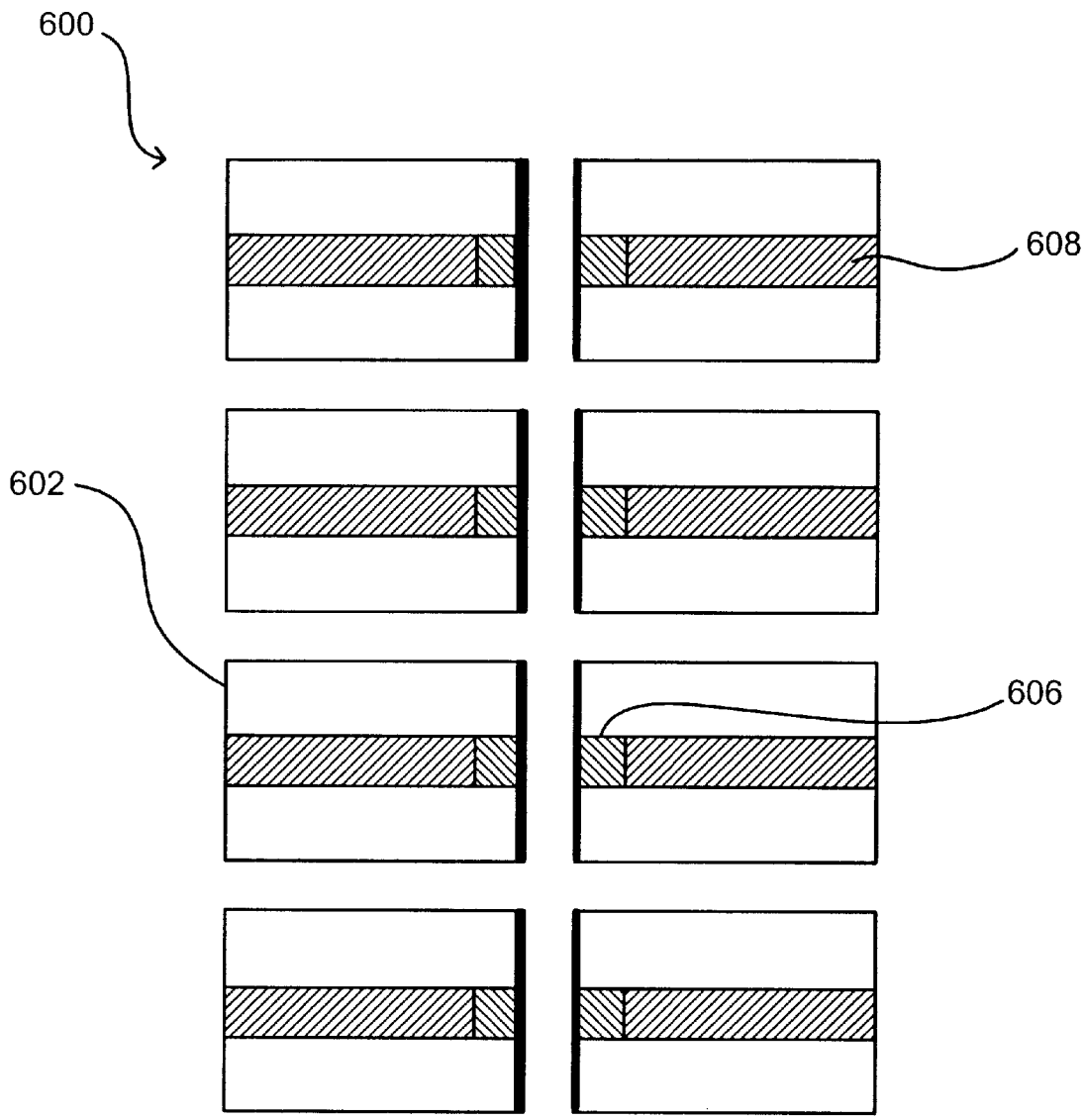
FIGS. 8A and 8B show front and side views of a stage in the manufacturing process of a microstrip termination in accordance with one embodiment of the present invention.
Figure 8B:
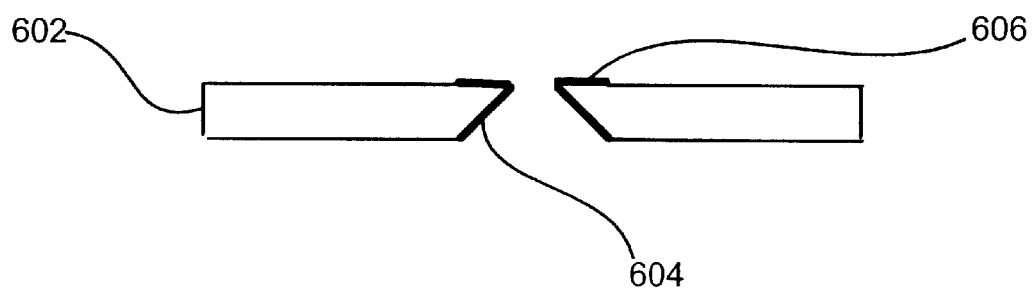

The circuits with tapered ground planes are shown after dicing to complete manufacturing in FIGS. 8A and 8B. A saw without a tapered edge may be used to divide the substrate into individual circuits. The saw may or may not align using laser drill holes 506. Each circuit has a tapered plane 604 of about 30 degrees, an area of resistive material 606, and a transmission line 608 as described above.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A method for manufacturing circuits having microstrip termination, comprising the steps of:
    cutting a tapered edge into a substrate having a top surface and a bottom surface;
    depositing conductive material on the top surface, bottom surface, and tapered edge of the substrate;
    etching the deposited conductive material in order to form a transmission line on the top surface of the substrate and a tapered around plane on the tapered edge, the tapered around plane connecting the transmission line to the conductive material deposited to form a ground plane of the bottom surface of the substrate;
    etching the transmission line away in an area to form an area of thin film resistive material on the top surface of the substrate, the area of thin film resistive material adapted to terminate a signal propagating along the transmission line; and
    dicing the substrate in order to form individual circuits, each circuit having a transmission line an area of resistive material, and a tapered edge.

2. The method of claim 1, further comprising the step of creating holes in the substrate along an area where the tapered edge is to be cut before said step of cutting the tapered edge.

3. The method of claim 1, wherein the tapered edge has an angle of about 30 degrees with respect to the top surface of the substrate.

4. The method of claim 1, wherein said step of cutting the tapered edge includes cuffing the substrate using a diamond saw with a blade having a tapered edge.

5. The method of claim 1, wherein said transmission line is etched so that a portion of the transmission line connects the thin film resistive material to the tapered ground plane.

6. The method of claim 1, wherein said forming step includes forming a tapered edge having a taper angle such that there is substantially no impedance change for a signal propagating down the transmission pattern through the area of resistive material toward the tapered edge.

7. A method for manufacturing circuits having microstrip termination, comprising the steps of:
    forming a tapered edge into a substrate having a top surface and a bottom surface;
    forming a conductive transmission line on the top surface of the substrate extending to the tapered edge of the substrate;
    forming an area of resistive material alone the transmission line, the area of resistive material adapted to terminate a signal propagating alone the transmission line;
    forming a conductive ground plane on the bottom surface of the substrate and a tapered ground plane on the tapered edge, the tapered round plane connected to the conductive ground plane and coupled to the area of resistive material; and
    sectioning the substrate in order to form individual circuits, each circuit having a transmission line, an area of resistive material, and a tapered edge.

8. The method of claim 7, wherein the tapered edge is tapered at an angle of of about 30 degrees with respect to the top surface of the substrate.

9. The method of claim 7, wherein the substrate comprises alumina.

10. The method of claim 7, wherein a portion of the transmission line couples the tapered around plane to the area of resistive material.

11. The method of claim 7, wherein the conductive ground plane extends only over a portion of the bottom surface.

* * * * *

UNITED STATES PATENT AND TRADEMARK OFFICE
CERTIFICATE OF CORRECTION

PATENT NO. : 6,660,174 B2
DATED : December 9, 2003
INVENTOR(S) : William Oldfield It is certified that error appears in the above-identified patent and that said Letters Patent is hereby corrected as shown below:

Column 4,
Line 19, delete "a transmission line an area of" and insert therefor -- a transmission line, an area of --;
Lines 45-46, delete "resistive material alone the transmission line" and insert therefor -- resistive material along the transmission line --;
Line 51, delete "the tapered round plane" and insert therefor -- the tapered ground plane; --; and
Line 62, delete "the tapered around plane" and insert therefor -- the tapered ground plane --.

Signed and Sealed this

Twenty-eighth Day of December, 2004

JON W. DUDAS
*Director of the United States Patent and Trademark Office*